US009958492B2

(12) United States Patent
Bierman et al.

(10) Patent No.: US 9,958,492 B2
(45) Date of Patent: May 1, 2018

(54) PARTIAL DISCHARGE SIGNAL DETECTION USING RESISTIVE ATTENUATION

(71) Applicants: Adam Bierman, Fort Collins, CO (US); Michael Hon, Thornton, CO (US)

(72) Inventors: Adam Bierman, Fort Collins, CO (US); Michael Hon, Thornton, CO (US)

(73) Assignee: AKTIEBOLAGET SKF, Gothenburg (SE)

(*) Notice: Subject to any disclaimer, the term of this patent is extended or adjusted under 35 U.S.C. 154(b) by 103 days.

(21) Appl. No.: 14/842,937

(22) Filed: Sep. 2, 2015

(65) Prior Publication Data
US 2017/0059643 A1    Mar. 2, 2017

(51) Int. Cl.
*G01R 31/12*    (2006.01)
(52) U.S. Cl.
CPC .................. *G01R 31/1272* (2013.01)
(58) Field of Classification Search
CPC ............................ G01R 31/1272; G01R 31/12
USPC ......................................................... 324/551
See application file for complete search history.

(56) References Cited

U.S. PATENT DOCUMENTS

| 5,594,348 | A  | * | 1/1997  | Iijima  | G01R 31/1227 |
|           |    |   |         |         | 324/523      |
| 5,801,530 | A  | * | 9/1998  | Crosby  | G01B 7/023   |
|           |    |   |         |         | 174/36       |
| 7,100,455 | B2 | * | 9/2006  | Lepine  | G01L 9/02    |
|           |    |   |         |         | 324/670      |
| 2009/0067200 | A1 | * | 3/2009 | Bolz  | H02J 7/0014  |
|           |    |   |         |         | 363/17       |
| 2011/0316336 | A1 | * | 12/2011 | Okubo | G06F 1/266  |
|           |    |   |         |         | 307/23       |
| 2012/0182040 | A1 | * | 7/2012 | Obata  | G01R 31/346  |
|           |    |   |         |         | 324/765.01   |

* cited by examiner

*Primary Examiner* — Jeff Natalini
(74) *Attorney, Agent, or Firm* — Bryan Peckjian; SKF USA Inc. Patent Dept.

(57) ABSTRACT

The disclosure herein relates to a partial discharge detection board comprising a high voltage resistor divider. The high voltage resistor divider can reduce a voltage peak of an impulse surge generated by a surge board. The high voltage resistor divider can also include a high side with a first resistance and a low side with a second resistance.

10 Claims, 3 Drawing Sheets

PARTIAL DISCHARGE SIGNAL DETECTION USING RESISTIVE ATTENUATION

BACKGROUND

Partial discharge is a localized dielectric breakdown of a portion of an electrical insulation system of a device (e.g., a motor) under high voltage stress. The localized dielectric breakdown can be caused by one or more cracks, voids, or inclusions in the insulation system. A partial discharge can cause damage to the device and indicates that the insulation system is failing, which may further lead to catastrophic damage to the device. Thus, it is desirable to detect partial discharges so that the insulation system may be repaired or replaced before any damage to the device.

SUMMARY

Embodiments herein relates to a partial discharge detection board comprising a high voltage resistor divider. The high voltage resistor divider can reduce a voltage peak of an impulse surge generated by a surge board. The high voltage resistor divider can also include a high side with a first resistance and a low side with a second resistance.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments described herein relate to partial discharge detection using resistive attenuation. More particularly, embodiments described herein can relate to resistive pickup operation for high frequency partial discharge signatures in inductive coils under impulse stimulation.

Partial discharge detection is a difficult measurement to perform in a consistent manner across varying devices because of differences in a host measuring unit and strength of a stimulating surge impulse. In addition, different detection operations for the varying devices yield different results based on the signal frequencies being captured and analyzed. For example, contemporary detection methods utilizing antennas, hard-wired coupling capacitors, or hard-wired current transformers fail to show consistent results across multiple devices, as antennas are directionality dependent for emission pick-up and hard-wired coupling capacitors or current transformers include defined frequency parameters that eliminate a large amount of signal information prior to analysis.

Embodiments described herein institute a resistive attenuation concept that allows for inexpensive and more efficient detection of partial discharge signatures using high voltage precision resistors. For example, an entire frequency spectrum can pass through non-inductive thick film resistors to bring the entire signal down to a manageable voltage level for digitization and analysis (which is in contrast to the contemporary detection methods that eliminate large amounts of signal information prior to analysis).

It will be appreciated that embodiments described herein will reduce manufacturing cost due to the non-inductive thick film resistors being an inexpensive component, requiring less set-up and preparation for devices under test. Further, the non-inductive thick film resistors are not affected directionally or by signal reception issues and allow for rapid reconfiguration of digital processing parameters for more flexible and varied analysis.

Figure 1:
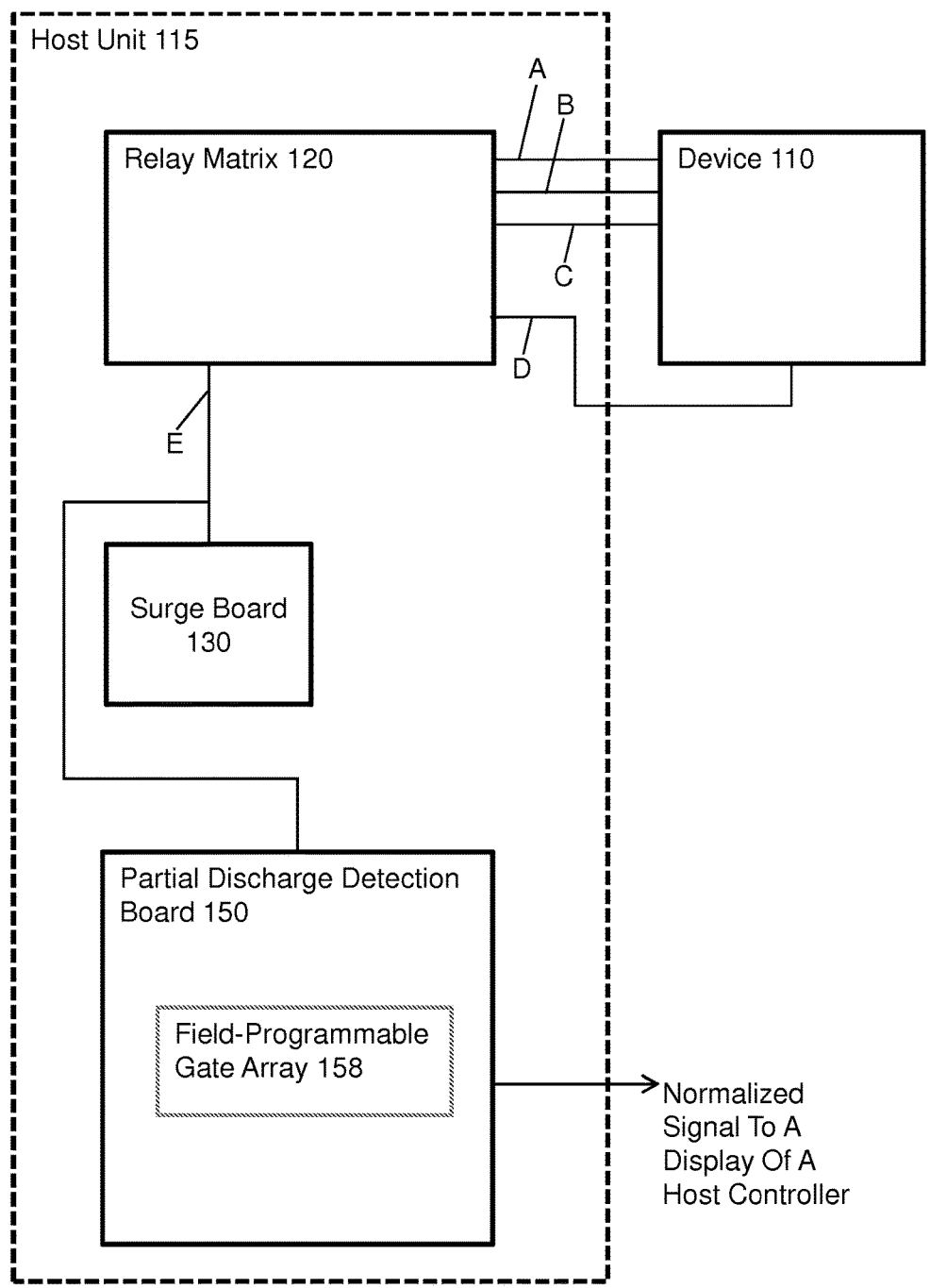
FIG. 1 is a schematic view of a system for detecting a partial discharge according to an embodiment of the present invention.

Turning now to FIG. 1, a schematic view of a system 100 for detecting a partial discharge according to an embodiment of the present invention is generally shown to include a device 110 and a host unit 115.

The device 110 is a component under test for partial discharges including an electrical insulation. An example of the device 110 is a motor stator. Motor stators, in application, can be used in locomotive engines, power plants, generators, etc. Motor stators can be configured as an open frame or as an encased design, with a rotor installed or not installed. For instance, the motor stator can include a form wound coil where the coils are formed, dipped, and insulated before being inserted into the slots of the motor stator and connected on the ends. Testing motor (i.e., testing for partial discharges) may generally be performed with respect to manufacturing or repairing of the motor stators. Further, testing can be performed on the individual coils of the motor stator or the entire device 110.

The host unit 115 is a testing component configured to perform offline partial discharge testing of the device 110. The host unit 115 includes a relay matrix 120, a surge board 130, and a partial discharge detection board 150. The host unit 115 utilizes high voltage wires to connect to the device, as illustrated by test leads A, B, C and a line side connection D (a ground connection). Additionally, the elements of the host unit 115 are connected internally, for example, by a line connection E.

In operation, the host unit 115 applies a surge impulse to the device 110 while the device 110 is offline (e.g., applies the surge impulse through one of the test leads A, B, or C, while the remaining two leads are grounded to line side connection D). The surge impulse can include a voltage from 0 kV to 15 kV, that can be stored and discharged from a capacitor. In one example, a surge impulse of 15 kV can be reached in less than or equal to 100 ns). The application of the surge impulse results in a reflective waveform that is received from the device 110 by the host unit 115 through the test lead A, B, or C that provided the impulse.

The reflective waveform, which in one example is a damped sinusoid, includes the partial discharges generated by the surge impulse. That is, the reflective waveform can include a spike voltage that corresponds to the peak voltage of the surge impulse followed by ring voltages. Partial discharges can be detected within the spike voltage. Further, the ring voltages can also include subsequent spike voltages in which subsequent partial discharges can be detected. Note that the ring voltages are responsive to the peak voltage and can last hundreds of microseconds, which is comparatively longer than the peak voltage, depending on the device 110.

The relay matrix 120 is an element of the host unit 115 that includes one or more relays. The relay matrix 120 is configured to switch between test leads A, B, C to connect to the device 110. For example, as shown in FIG. 1, the relay matrix 120 can switch between three test leads A, B, C to account for the three electrical phases of the device 110. The test leads A, B, C can include alligator clips that attach directly to terminals of the device 110 and the host unit 115. In the case of the form wound coil, the test leads can be attached directly to the coils themselves. Note that, while physically attached to both the device 110 and host unit 115, the test leads are electrically connected individually (e.g., one at a time) to the device 110 by the relay matrix 120, such that the surge impulse arrives at the device 110 through a single path. The relay matrix 120 is also the receiving point for the line side connection D, which is a ground a connection. In operation, any reflective waveforms resulting from the surge impulse, regardless of which test lead A, B, or C is active, is received by the relay matrix 120 via that same test lead. In this way, the relay matrix 120 can supply the reflective waveform to the partial discharge detection board 150 via the line connection E.

The surge board 130 is an element of the host unit 115 configured to apply the surge impulse to the device 110 (e.g., via the line connection E, the relay matrix 120, and the connected test lead A, B, or C). The surge board 130, in some embodiments, can include a high voltage capacitor that is charged by a high voltage power supply. The surge board 130 can also include a high voltage stack that triggers the high voltage capacitor. For example, once the high voltage capacitor is fully charged to the peak voltage by the high voltage power supply, the high voltage stack triggers the high voltage capacitor to quickly discharge through the line connection E, the relay matrix 120, and the connected test lead A, B, or C to the device 110, thereby delivering the surge impulse. As noted above, the surge impulse results in the reflective waveform that travels through the connected test lead A, B, or C, the relay matrix 120, and the line connection E to the partial discharge detection board 150.

The partial discharge detection board 150 is a component of the host unit 115 configured to receive and processes the reflective waveform to detect partial discharges. The partial discharge detection board 150 can include a field-programmable gate array 158. The field-programmable gate array 158 is an integrated circuit configurable via an array of programmable logic blocks, and a hierarchy of reconfigurable interconnects that allow the array of programmable logic blocks to be "wired together." For example, the field-programmable gate array 158 can be configured to include a compensation heuristic that tunes values of partial discharges within the reflective waveform. In general, the compensation heuristic can be loaded into a field-programmable gate array of different host units to enable the setting of compensation (e.g., enable normalization of the partial discharge signals) for testing a device 110. The partial discharge detection board 150 can also include one or more resistors that form a voltage divider (e.g., a resistor divider), one or more operational amplifiers, and a bus interconnecting each of these items to each other and a microcontroller.

Figure 2:
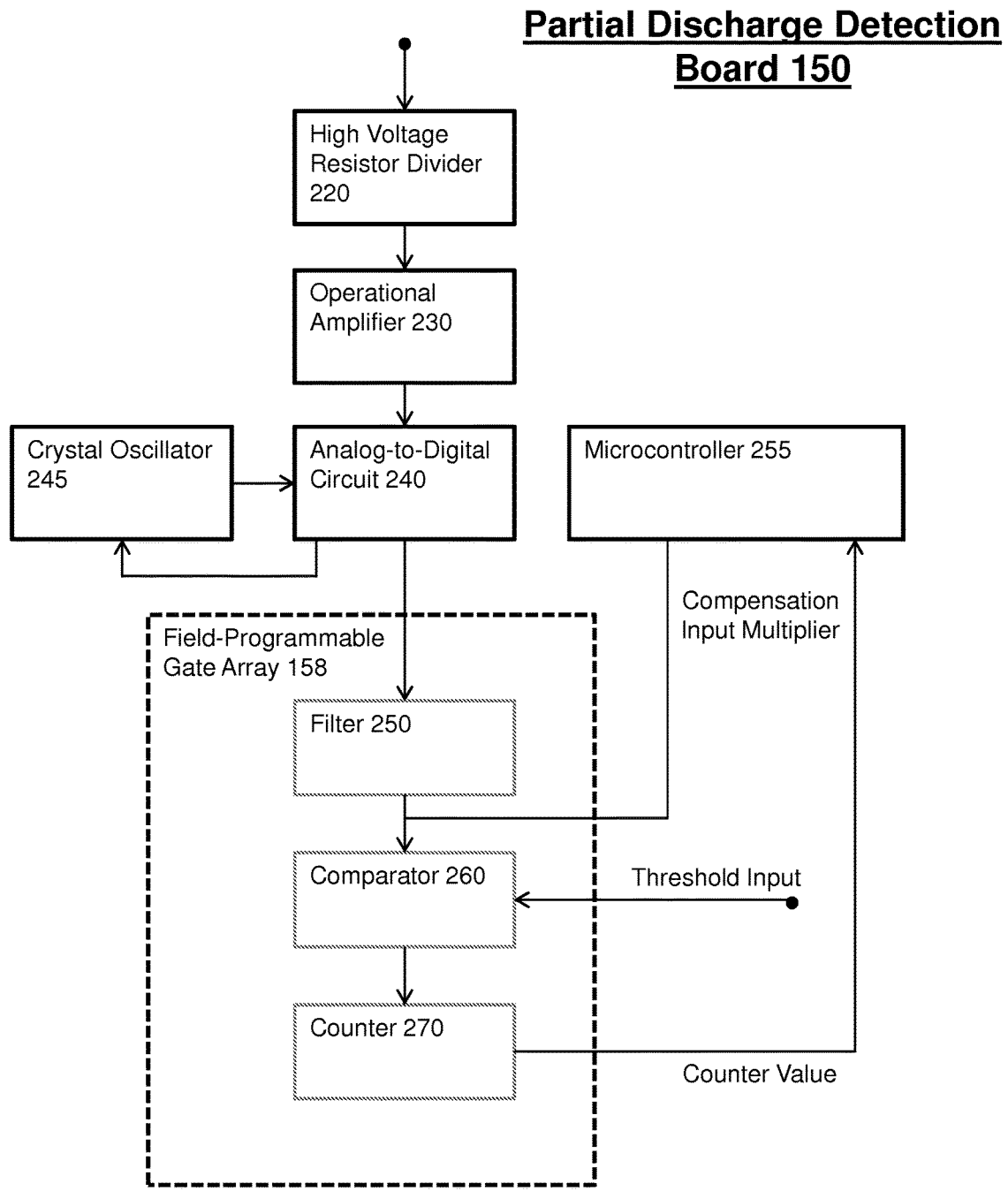
FIG. 2 is a schematic view of a partial discharge detection board of a system according to an embodiment of the present invention.

The partial discharge detection board 150 will now be described with respect to FIG. 2. In FIG. 2, a high voltage resistor divider 220 of the partial discharge detection board 150 receives an input signal, such as the reflective waveform. Upon receipt of a reflective waveform, the high voltage resistor divider 220 reduces the reflective waveform to a voltage level that is usable and safe for all the low voltage components of the partial discharge detection board 150. The voltage level (e.g., the level of attenuation) can also be determined by gain stages controlled by relays of the partial discharge detection board 150 (e.g., the partial discharge detection board 150 can include four gain stages to attenuate the reflective waveform). For instance, the partial discharge detection board 150 is configured to recognize if the reflective waveform is a signal that is too large for the low voltage components of the partial discharge detection board 150 and to automatically switch to between the gain stages to further attenuate the reflective waveform based on this recognition.

Next, an operational amplifier 230 (e.g., a unity gain operation amplifier) of the partial discharge detection board 150 acts as a buffer and isolates the reflective waveform from the rest of the partial discharge detection board 150. In turn, the operational amplifier 230 can provide an upper limit to the reflective waveform, such as by limiting the bandwidth to 235 MHz.

The reflective waveform is then passed to the analog-to-digital circuit 240 for analog-to-digital sampling. The analog-to-digital circuit 240 includes an analog-to-digital drive circuit and an analog-to-digital converter that together process the reflective waveform into a digital signal acceptable to the field-programmable gate array 158. Note that before the analog-to-digital sampling, a crystal oscillator 245 defines a sampling rate of the analog-to-digital circuit 240. To define the sampling rate, the crystal oscillator 245 by utilizes a mechanical resonance of a vibrating crystal to allow the analog-to-digital circuit 240 to recreate the reflective waveform in digital form at the resonance frequency of that crystal. Note that no filtering is performed before the analog-to-digital sampling. For example, all frequencies up to 235 MHz are conditioned by the crystal oscillator 245. Also, note that, at this stage, the partial discharge detection board 150 cannot distinguish between the frequency information other than magnitude due to signal aliasing above the Nyquist frequency (i.e., an upper limit of that frequency can be set out in a spectrum based on a sampling rate, such as half the sampling rate).

Once the reflective waveform is converted to the digital signal by the analog-to-digital circuit 240, the digital signal is passed to the field-programmable gate array 158. The field-programmable gate array 158 can include virtual components that implement the compensation heuristic, such as a filter 250, a microcontroller 255, a comparator 260, and a counter 270. The digital signal may be passed between the analog-to-digital circuit 240 and the field-programmable gate array 15 via a bus, such as a 12-bit bus.

Note that the digital signal that is passed to the field-programmable gate array 158 is dependent on a plurality of factors unique to a particular test being performed on the device 101. The plurality of factors is a set different gains and unknowns that yield different amplitudes of signals for the same waveform under different conditions. Examples of the plurality of factors may include a maximum voltage of the test being executed, a high voltage attenuation impedance (e.g., 100 kOhms for a 12 kV tester or below; 200 kOhms for a 15 kV tester), a gain of the low voltage stage of the divider (the gain is set by the field-programmable gate array 158 based on the overflow signal from the analog-to-digital converter), any inconsistencies between the items of the partial discharge detection board 150, etc.

The digital signal is noisy when it is passed to the field-programmable gate array 158. In turn, the filter 250 of the field-programmable gate array 158 isolates high frequency information of the noisy digital signal so that this high frequency information may pass through the field-programmable gate array 158 for further analysis. For example, with a 100 ns rise time with respect to the surge impulse, a radio frequency component ranging in the 20 Mhz to 235 Mhz range may pass through the field-programmable gate array 158 for further analysis. Further, by utilizing a digital 100-pole finite impulse response high pass filter with a cutoff frequency set to 20 MHz, as the filter 250, any waveforms ranging below 20 MHz) are completely eliminated.

After filtering, the field-programmable gate array 158 can utilize an input from the microcontroller 255 to normalize the digital signal received from the filter 250. The input can be a compensation input multiplier (also referred to as a compensation value) that is user defined during a calibration operation of the partial discharge detection board 150. The defining or setting of the compensation value multiplier during the calibration operation ensures that the millivolts of the partial discharge look the same across multiple host units. The calibration operation, in general, includes setting the compensation value within a microcontroller of a partial discharge board 150 during manufacturing of the host unit 155

The field-programmable gate array 158 can further utilize the comparator 260 to check that levels of the digital signal, which is based on the compensation input multiplier of the microcontroller 255 being combined with the isolated high frequency information from the filter 250. The comparator 260 is configured to check the levels of the digital signal by comparing each level to a threshold input. When the comparator 260 determines that level of the digital signal exceeds the threshold input, the comparator 260 send a signal to the counter 270 of the field-programmable gate array 158 that causes the counter 270 to increments. Each increment corresponds to a detection of a partial discharge within the digital signal received from the filter 250. A value of the counter is a normalized amount that passed to the microcontroller 255 of the partial discharge detection board 150.

The microcontroller 255 provides the counter value (e.g., the normalized partial discharge signals) to a host controller unit for display. The host controller is a computing device including a display, a processor, and a memory and is configured to receive and display the normalized partial discharge signal. In this way, the field-programmable gate array 159 can provide the partial discharge signals to different host controller units that display the same values for the partial discharge information received, regardless of the type of controller unit.

Figure 3:
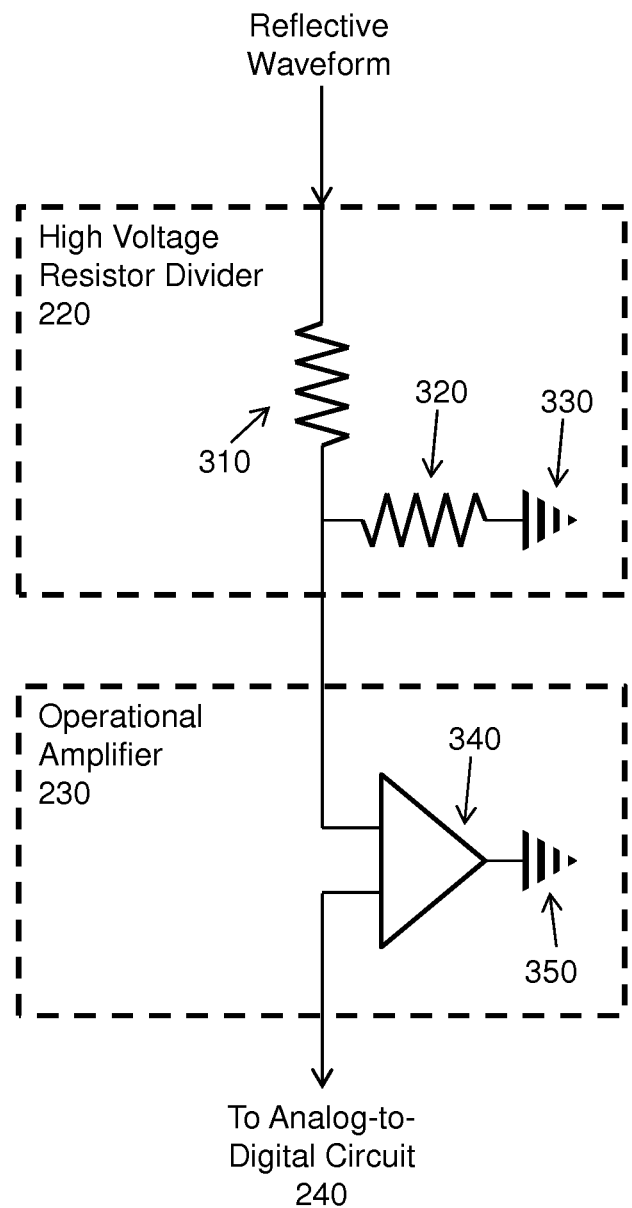
FIG. 3 is a schematic view of a high voltage resistor divider according to an embodiment of the present invention.

Turning now to FIG. 3, a schematic view of the high voltage resistor divider 220 and the operational amplifier 230 that enable a resistive pick-up method is provided. In general, the resistive pick-up method implemented by the high voltage resistor divider 220 and the operational amplifier 230 participates in detecting partial discharges in the device 110 (e.g., coils/stators) stimulated by high voltage surge impulses (e.g., impulse surge described above).

Note that contemporary detection methods eliminate large amounts of signal information prior to analysis by removing the impulse surge through analog filtering (thereby preventing the full spectrum of impulse surge from entering the partial discharge detection board 150). In contrast, the resistive pick-up method enables the impulse surge to enter the partial discharge detection board 150 because the digital filtering performed by the partial discharge detection board 150 can remove the impulse serge with higher precision than the analog filtering. In turn, the partial discharge detection board 150 can capture the full spectrum of the impulse surge.

In FIG. 3, the high voltage resistor divider 220 utilizes a first resistance 310 and a second resistance 320 to implement a resistive pick-up operation.

The first resistance 310 is high side of the high voltage resistor divider 220 and can vary in structure based on the type of host unit 115. For example, in a high voltage, 15 kV host unit, the first resistance 310 can include two 100 k Ohm non-inductive resistors connected in series (thereby providing a total resistance of 200 k Ohm resistance). Alternatively, in a low voltage host unit, such as 4 kV, 6 kV, or 12 kV application, the first resistance 310 can include a 100 k Ohm non-inductive resistor.

The second resistance 320 is a low side of the high voltage resistor divider 220 and can include a low value gain resistor connected to a ground 330. The operational amplifier 230 includes a buffering wide bandwidth operational amplifier 340 set to a ground 350.

The partial discharges detected in reflective voltage impulses (e.g., a reflective waveform) can reach a peak of 15 kV for a brief period before being attenuated. Attenuation occurs through the first resistance 310 and a low value gain resistor (e.g., the second resistance 320) to maintain a maximum of +/−1V input signal to the buffering wide bandwidth operational amplifier 340 (which, as described above, is then digitized and passed to a the field-programmable gate array 158 for signal analysis).

Technical effects and benefits of the above embodiments which utilize a resistive attenuation concept include inexpensive and more efficient detection of partial discharge signatures using high voltage precision resistors, such that an entire frequency spectrum can pass through high voltage precision resistors to bring the entire signal down to a manageable voltage level for digitization and analysis (e.g., utilizing the resistive attenuation concept enables a broader segment of frequencies to pass than contemporary pick-up methods). Further, by utilizing the resistive attenuation concept, the technical effects and benefits of the above embodiments include enabling the partial discharge detector board to be integrated directly with the surge board in the same host unit, such that the surge waveform and partial discharge waveform (e.g., impulse surge and reflective waveform) can be analyzed and compared by the same host unit.

The technical effects and benefits of the above embodiments also include reducing manufacturing cost due to the high voltage precision resistors being an inexpensive component, requiring less set-up and preparation for devices under test. In addition, the high voltage precision resistors are not affected directionally or by signal reception issues and allow for rapid reconfiguration of digital processing parameters for more flexible and varied analysis (e.g., the characteristic spectrum analysis is more configurable due to the digital nature of the processing and the unfiltered or altered input signal).

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A system comprising:
    a host unit;
    a surge board;
    a partial discharge detection board comprising an operational amplifier and a high voltage resistor divider configured to reduce a voltage peak of an impulse surge generated by the surge board,
    wherein the partial discharge detector board is directly integrated with the surge board in the host unit enabling the host unit to analyze and compare the impulse surge and a reflective waveform generated by the impulse surge,
    the high voltage resistor divider comprising:
        a high side comprising a first resistance,
        wherein the high side is connected to a line connection that receives from the host unit the reflective waveform; and
        a low side comprising a second resistance, wherein the low side connects the high side and the operational amplifier,
        wherein the second resistance comprises a low value gain resistor connected to a ground,
    and wherein the first resistance comprises 200 k Ohm of resistance.

2. The system of claim 1, wherein the first resistance comprises a 100 k Ohm non-inductive resistor.

3. The system of claim 1, wherein the host unit comprises a low voltage host unit.

4. The system of claim 1, wherein the first resistance comprises two 100 k Ohm non-inductive resistors connected in series.

5. The system of claim 1, wherein the host unit comprises a high voltage 15 kV host unit.

6. The system of claim 1, wherein the first resistance and second resistance maintain a maximum of +/−1V input signal to the operational amplifier.

7. The system of claim 1, wherein the partial discharge detection board comprises the operational amplifier set to a ground.

8. The system of claim 7, wherein the operational amplifier isolates the reflective waveform from a remaining portion of the partial discharge detection board.

9. The system of claim 7, wherein the operational amplifier provides an upper limit to the reflective waveform.

10. The system of claim 9, wherein the upper limit is 235 MHz.

* * * * *